United States Patent
Kawasumi

(10) Patent No.: US 9,646,992 B2
(45) Date of Patent: May 9, 2017

(54) SEMICONDUCTOR MEMORY

(71) Applicant: Kabushiki Kaisha Toshiba, Minato-ku, Tokyo (JP)

(72) Inventor: Atsushi Kawasumi, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/063,115

(22) Filed: Mar. 7, 2016

(65) Prior Publication Data
US 2017/0069659 A1 Mar. 9, 2017

(30) Foreign Application Priority Data

Sep. 3, 2015 (JP) ................................ 2015-174041
Feb. 25, 2016 (JP) ................................ 2016-034736

(51) Int. Cl.
*H01L 29/49* (2006.01)
*H01L 27/118* (2006.01)

(52) U.S. Cl.
CPC ............... *H01L 27/11807* (2013.01); *H01L 2027/11812* (2013.01); *H01L 2027/11838* (2013.01); *H01L 2027/11848* (2013.01); *H01L 2027/11864* (2013.01); *H01L 2027/11881* (2013.01)

(58) Field of Classification Search
CPC ..... H01L 27/11807; H01L 2027/11812; H01L 2027/11838; H01L 2027/11848; H01L 2027/11864; H01L 2027/11881
See application file for complete search history.

(56) References Cited

U.S. PATENT DOCUMENTS

| | | | |
|---|---|---|---|
| 4,142,234 A * | 2/1979 | Bean | G06F 12/0808 711/121 |
| 7,271,615 B2 | 9/2007 | Afghahi et al. | |
| 8,081,502 B1 * | 12/2011 | Rahim | G11C 11/412 365/154 |
| 8,149,642 B2 | 4/2012 | Kim | |
| 8,406,039 B2 | 3/2013 | Lee et al. | |

(Continued)

FOREIGN PATENT DOCUMENTS

| | | |
|---|---|---|
| JP | 2009-016039 A | 1/2009 |
| JP | 2009-505588 A | 2/2009 |
| JP | 2010-186529 A | 8/2010 |

*Primary Examiner* — Michael Shingleton
(74) *Attorney, Agent, or Firm* — Knobbe, Martens, Olson & Bear, LLP

(57) ABSTRACT

According to one embodiment, a semiconductor memory 100 includes a memory cell array 100A composed of a plurality of SRAM cells 10 including NMOS transistors and PMOS transistors, and a bias circuit 100B connected to a ground GND1 or power supply voltage VDD1 of the memory cell array 100A. The bias circuit 100B includes NMOS transistors 121, 122, 133 and 134 that are same as the NMOS transistors of the SRAM cells 10 in terms of channel length and channel width and in terms of dopant and dose amount at a channel portion, and PMOS transistors 111 and 112 that are same as the PMOS transistors of the SRAM cells 10 in terms of channel length and channel width and in terms of dopant and dose amount at a channel portion. Diffusion regions of the NMOS transistors and the PMOS transistors are formed in a same semiconductor layer.

10 Claims, 14 Drawing Sheets

(56) References Cited

U.S. PATENT DOCUMENTS

| | | | | |
|---|---|---|---|---|
| 2010/0073137 A1* | 3/2010 | Kobayashi | ......... | G06K 19/0723 340/10.1 |
| 2011/0063893 A1* | 3/2011 | Behera | .................. | G11C 11/412 365/154 |
| 2013/0297895 A1* | 11/2013 | Sakamaki | ........... | G06F 13/1694 711/154 |
| 2015/0263175 A1* | 9/2015 | Koyama | ............. | H01L 29/7869 365/189.09 |

* cited by examiner

SEMICONDUCTOR MEMORY

CROSS-REFERENCE TO RELATED APPLICATIONS

This application is based upon and claims the benefit of priority from Japanese Patent Application No. 2015-174041, filed on Sep. 3, 2015 and Japanese Patent Application No. 2016-034736, filed on Feb. 25, 2016; the entire contents of all of which are incorporated herein by reference.

FIELD

Embodiments described herein relate generally to a semiconductor memory.

BACKGROUND

An SRAM (Static Random Access Memory), which is a semiconductor memory device, has the advantage of very low power consumption, because it can store data without requiring a regular refresh operation as used in a DRAM (Dynamic Random Access Memory).

However, in the case of an SRAM that performs no regular refresh operation, the retention characteristic is deteriorated due to leakage currents generated during standby, as the case may be. Conventionally, in consideration of this problem, the power supply voltage (VDD) inside the cell array is set lower so that the leakage currents in memory cells can be suppressed. However, according to this method, it is difficult to stabilize the VDD thus lowered, with respect to variations in process conditions, power supply voltage, and/or process temperature (which will be referred to as "PVT" (Process/Voltage/Temperature), hereinafter). Thus, there is a case that the retention characteristic is deteriorated due to PVT variations.

DETAILED DESCRIPTION

Exemplary embodiments of a semiconductor memory will be explained below in detail with reference to the accompanying drawings. The present invention is not limited to the following embodiments.

Embodiment 1

Figure 1:
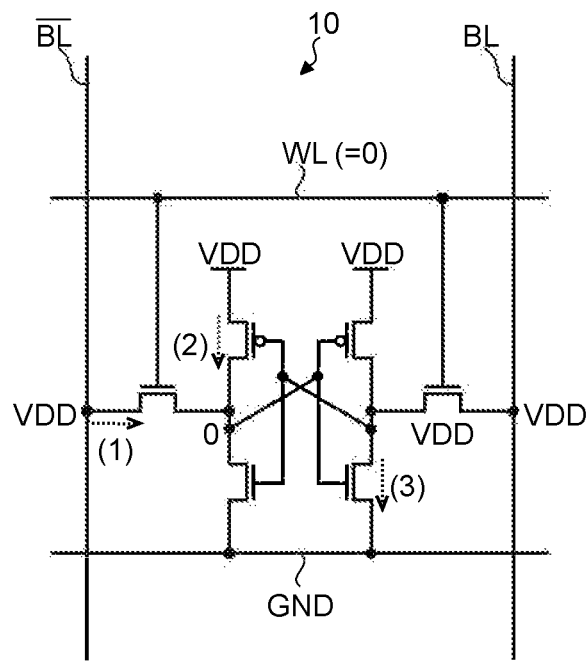
FIG. 1 is a view for explaining an example of leakage currents generated in a typical memory cell of an SRAM.

In the embodiment 1, at first, an explanation will be given of an example of leakage currents generated in a memory cell of an SRAM (which will be referred to as "SRAM cell", hereinafter), by use of a typical SRAM cell structure. FIG. 1 is a view for explaining an example of leakage currents generated in a typical SRAM memory cell. Here, FIG. 1 shows an example in which the GND is electrically floating to suppress the leakage currents during the retention.

As shown in FIG. 1, each SRAM cell 10 is composed of four transistors used for constituting two inverters cross-connected to each other, and two transistors used for constituting transfer gates for performing read and write. The cross-connected two inverters are configured to store a bit in the SRAM cell 10.

The leakage currents in the SRAM cell 10 mainly include a leakage current (1) through each of the NMOS (Metal-Oxide-Semiconductor) transistors constituting the transfer gates, an off-leakage current (2) through each of the PMOS transistors constituting the inverters, and an off-leakage current (3) through each of the NMOS transistors also constituting the inverters. These leakage currents change the GND potential in an electrically floating state. As a result, there is a case that the bit stored in the two inverters is changed, and thereby the retention characteristic of the SRAM cell 10 is deteriorated Further, the leakage currents generated in the SRAM cell 10 change depending on PVT variations. Accordingly, even if a method of simply setting the GND or VDD in an electrically floating state is used, it is difficult to stabilize the GND or VDD potential with respect to PVT variations, thereby entailing a fear that the retention characteristic is deteriorated.

Figure 2:
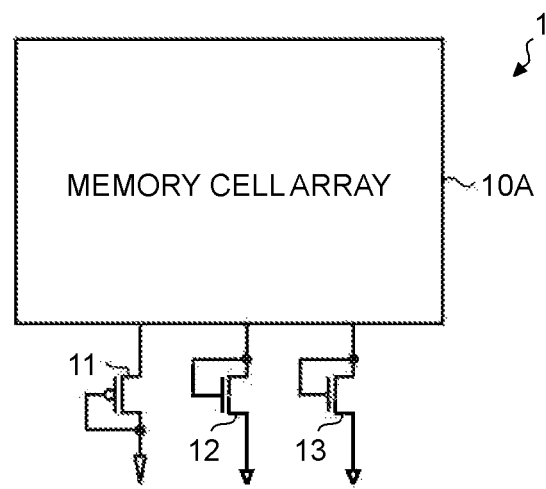
FIG. 2 is a schematic diagram showing a schematic configuration example of a semiconductor memory according to an embodiment 1.

In consideration of the matters described above, according to the embodiment 1, there is given an example of a semiconductor memory that can stabilize the GND or VDD potential even if a PVT variation occurs. FIG. 2 is a schematic diagram showing a schematic configuration example of a semiconductor memory according to the embodiment 1.

As shown in FIG. 2, the semiconductor memory 1 according to the embodiment 1 has a structure in which a memory cell array 10A composed of a plurality of SRAM cells arranged in a two-dimensional array is equipped with transistors 11 to 13 of three kinds configured to suppress the leakage currents (1) to (3) by respectively operating in sub-threshold regions. The number of transistors of each kind of the transistors 11 to 13 is not limited to one, but may be set appropriately in accordance with the scale of each of the leakage currents (1) to (3) generated in the memory cell array 10A.

The PMOS transistor 11 is a transistor for suppressing the off-leakage current (2) through the PMOS transistors constituting the inverters. This PMOS transistor 11 is configured to precisely generate a GND potential, by flowing a leakage current equal to the leakage current (2) generated in the entire memory cell array 10A.

One of the NMOS transistors 12 and 13 (which will be referred to as "NMOS transistor 12") is a transistor for suppressing the leakage current (1) through the NMOS transistors constituting the transfer gates, and the other one (which will be referred to as "NMOS transistor 13") is a transistor for suppressing the off-leakage current (3) through the NMOS transistors constituting the inverters. Each of these NMOS transistors 12 and 13 is configured to precisely generate a GND potential, by flowing a leakage current equal to the leakage current (1) or (3) generated in the entire memory cell array 10A.

The total amount of the leakage currents (1) to (3) generated in the memory cell array 10A can be expressed by the following formula (1). Thus, in the embodiment 1, the type (NMOS transistor or PMOS transistor) and/or the size (gate width W and gate length L) of each of the transistors 11 to 13 of three kinds are adjusted to compensate for the current amount expressed by the formula (1). Here, in the formula (1), Id denotes the leakage current amount, β denotes a gain coefficient, $V_{GS}$ denotes the voltage between the gate and source, $V_{TH}$ denotes a threshold voltage, γ denotes a back bias dependency coefficient for the threshold voltage $V_{TH}$, $V_{SB}$ denotes the voltage between the source and back gate, η denotes a channel length modulation effect coefficient, and $V_{DS}$ denotes the voltage between the drain and source.

$$Id = \beta \exp\left(\frac{V_{GS} - V_{TH} - \gamma V_{SB} + \eta V_{DS}}{NV_T}\right) \quad (1)$$

Figure 3:
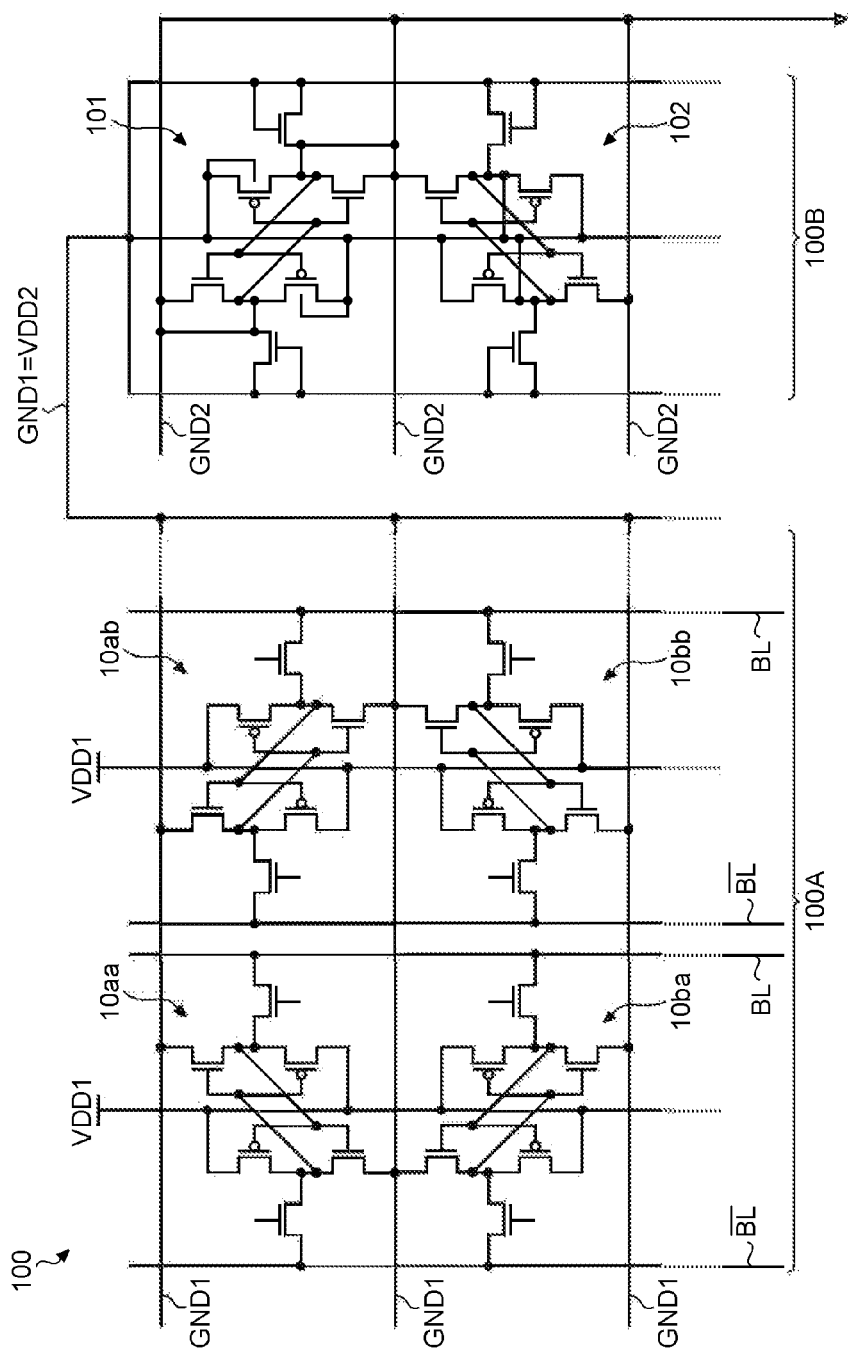
FIG. 3 is a schematic diagram showing a concrete configuration example of the semiconductor memory according to the embodiment 1.

Next, an explanation will be given of a more concrete configuration example of the semiconductor memory according to the embodiment 1. FIG. 3 is a schematic diagram showing a more concrete configuration example of the semiconductor memory according to the embodiment 1. As shown in FIG. 3, the semiconductor memory 100 according to the embodiment 1 includes a memory cell array 100A composed of a plurality of SRAM cells 10aa, 10ab, . . . , 10ba, 10bb, . . . arranged in a two-dimensional array, and a bias circuit 100B configured to compensate for leakage currents generated in the memory cell array 100A. In the following description, when the SRAM cells 10aa, 10ab, . . . , 10ba, 10bb, . . . do not need to be distinguished from each other, they will be identified by use of a reference symbol "10".

Each SRAM cell 10 may be formed of a typical SRAM cell, and may have the same structure as the SRAM cell 10 illustrated in FIG. 1, for example. In this case, the leakage currents (1) to (3) explained with reference to FIG. 1 are generated in the memory cell array 100A. The memory cell array 100A includes a GND1 connected to a bias circuit 100B and serving as a virtual power supply voltage VDD2 (corresponding to a first ground).

Figure 4:
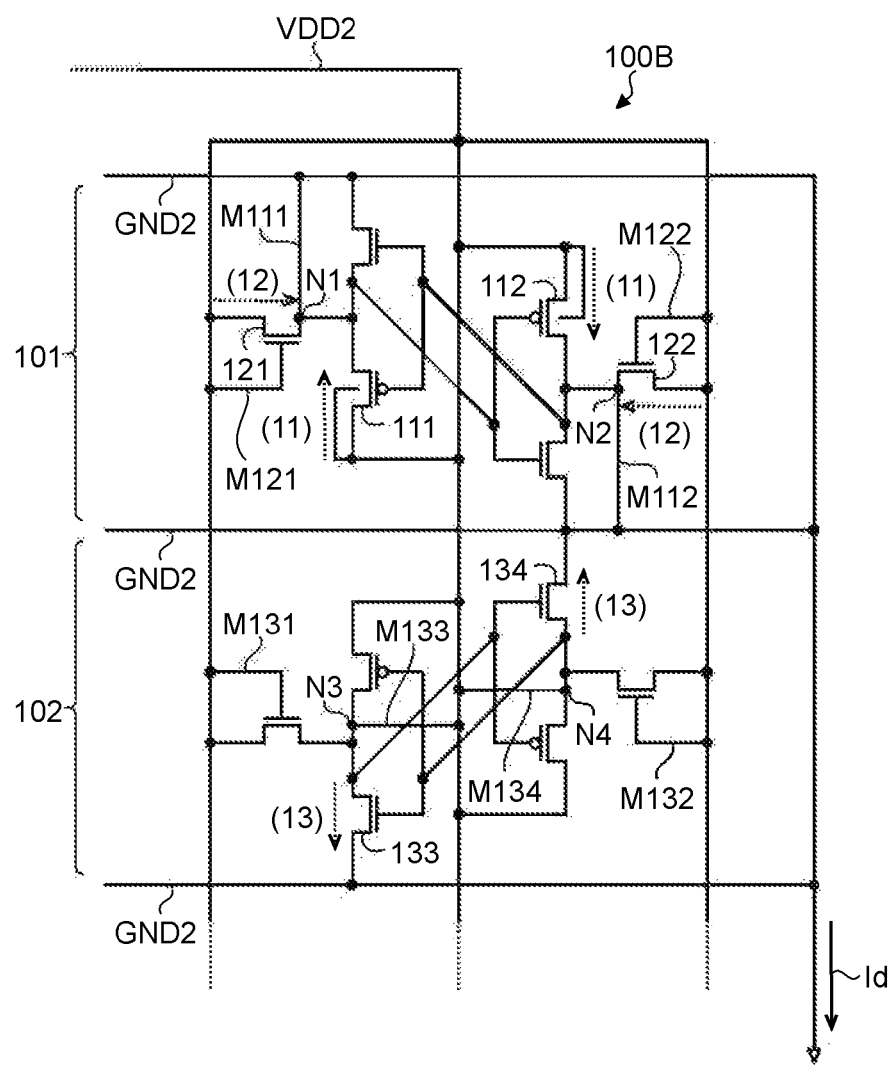
FIG. 4 is an enlarged view showing a bias circuit shown in FIG. 3.

The bias circuit 100B will be explained by use of an enlarged view shown in FIG. 4. As shown in FIG. 4, the bias circuit 100B includes cells (bias cells) 101 and 102 of two kinds each having almost the same structure as the SRAM cell 10. The number of cells of each kind of the cells 101 and 102 is not limited to one, but may be set appropriately in accordance with the scale of the leakage currents (1) to (3) generated in the memory cell array 100A. Here, the scale of the leakage currents generated in the memory cell array 100A is assumed to be a current amount given by the formula (1) described above.

The cell 101 having almost the same structure as the SRAM cell 10 includes two PMOS transistors 111 and 112 included in two inverters cross-connected to each other, and two NMOS transistors 121 and 122 constituting transfer gates. However, in the cell 101, each of the gates of the two NMOS transistors 121 and 122 constituting the transfer gates is not connected to the word line, but connected to the VDD2 via a wiring line M121 or M122. Further, of the six transistors constituting the cell 101, the sources of three transistors forming each group get together to a node N1 or N2, which is connected to a GND2 (a second ground) via a wiring line M111 or M112.

Similarly, the cell 102 having almost the same structure as the SRAM cell 10 includes two NMOS transistors 133 and 134 included in two inverters cross-connected to each other. However, in the cell 102, each of the gates of the two NMOS transistors constituting the transfer gates is not connected to the word line, but connected to the VDD2 via a wiring line M131 or M132. Further, of the six transistors constituting the cell 102, the sources of three transistors forming each group get together to a node N3 or N4, which is connected to the VDD2 via a wiring line M133 or M134.

The two PMOS transistors 111 and 112 of the cell 101 operate to flow an off-leakage current (11) equal to the off-leakage current (1) in the entire memory cell array 100A. Consequently, the off-leakage current (2) is compensated for. Similarly, the two NMOS transistors 121 and 122 of the cell 101 operate to flow a leakage current (12) equal to the leakage current (2) in the entire memory cell array 100A.

On the other hand, the two NMOS transistors 133 and 134 of the cell 102 operate to flow an off-leakage current (13) equal to the off-leakage current (3) in the entire memory cell array 100A.

The bias circuit 100B having the configuration described above is connected to the GND1 of the memory cell array 100A, and thereby makes it possible to flow the leakage currents (11) to (13) equal to the leakage currents (1) to (3) in the entire memory cell array 100A. Consequently, the GND1 potential can be stabilized.

Further, the leakage currents (1) to (3) in the entire memory cell array 100A change due to a PVT variation, but, in this case, the leakage currents (11) to (13) in the bias circuit 100B also change in response to the PVT variation in the same way. Accordingly, even if the total amount Id of the leakage currents (1) to (3) in the entire memory cell array 100A changes due to a PVT variation, it is possible to flow the leakage currents (11) to (13) equal to this current amount Id by the bias circuit 100B. As a result, the GND1 potential can be stabilized also with respect to PVT variations.

Figure 5:
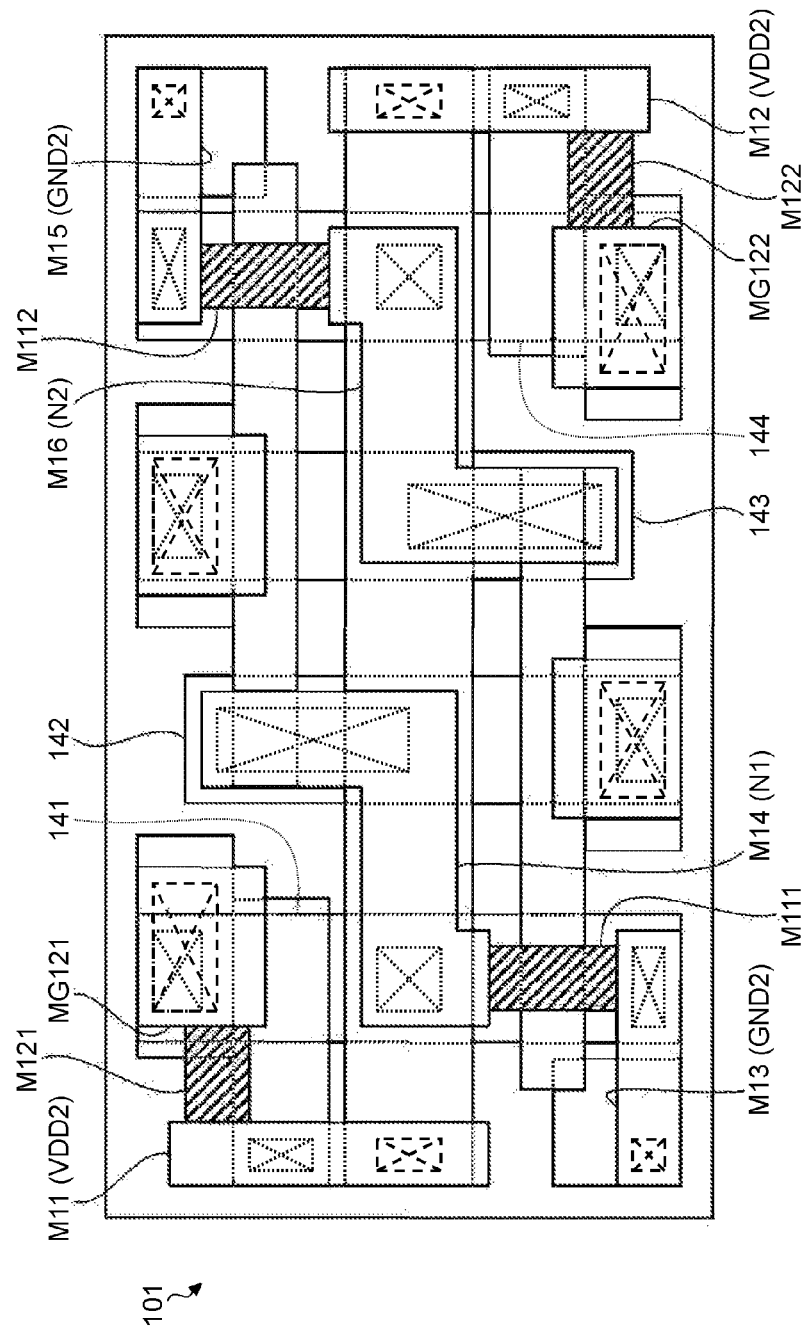
FIG. 5 is a schematic view showing a cell layout example according to the embodiment 1.
Figure 6:
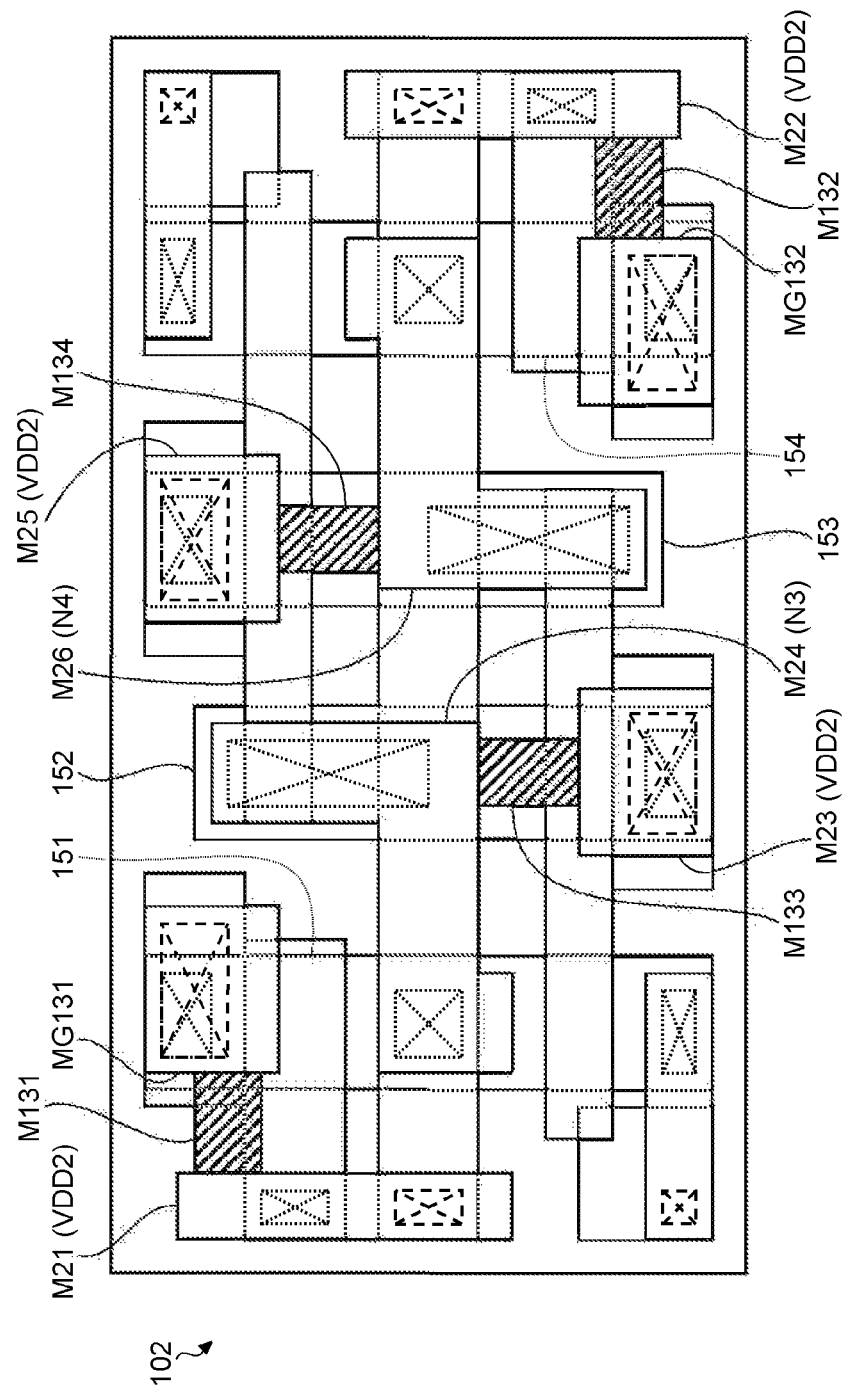
FIG. 6 is a schematic view showing another cell layout example according to the embodiment 1.

The cells 101 and 102 illustrated in FIG. 4 may be arranged adjacent to the memory cell array 100A in the column direction, as shown in FIG. 3, for example. Further, the layout of the typical SRAM cell illustrated in FIG. 1 may be utilized for the cells 101 and 102. FIG. 5 is a schematic view showing a layout example of the cell 101. FIG. 6 is a schematic view showing a layout example of the cell 102.

As shown in FIG. 5, the cell 101 has a structure including four transistors used for constituting two inverters cross-connected to each other, and two transistors used for constituting transfer gates for performing read and write, as in the layout of the typical SRAM cell (for example, see FIG. 1), such that these transistors are formed in diffusion regions 141 to 144 formed in the same semiconductor layer. These six transistors may be formed in the same layer as that of transistors used for constituting the SRAM cells 10. In this case, the SRAM cells 10 and the cell 101 share the same underlying layer. However, each of the gate MG121 of the NMOS transistor 121 and the gate MG122 of the NMOS transistor 122 is connected to a wiring line M11 or M12 forming the VDD2 via the wiring line M121 or M122. Further, of the transistors constituting the two inverters of the cell 101, the sources of three transistors forming each group get together to a wiring line M14 or M16 serving as a node N1 or N2, which is connected to a wiring line M13 or M15 forming the GND2 via a wiring line M111 or M112. Further, the connection of the gates (corresponding to the MG121 and MG122) of the transfer gates to the word line excluded, although this connection is included in the typical SRAM cell.

On the other hand, as shown in FIG. 6, the cell 102 similarly has a structure including four transistors used for constituting two inverters cross-connected to each other, and two transistors used for constituting transfer gates for performing read and write, such that these transistors are formed in diffusion regions 151 to 154 formed in the same semiconductor layer. These six transistors may be formed in the same layer as that of transistors used for constituting the SRAM cells 10, as in the cell 101. Also in this case, the SRAM cells 10 and the cell 102 share the same underlying layer. However, each of the gates MG131 and MG132 of the two NMOS transistors constituting the transfer gates is connected to a wiring line M21 or M22 forming the VDD2 via the wiring line M131 or M132. Further, of the transistors constituting the two inverters of the cell 102, the sources of three transistors forming each group get together to a wiring line M24 or M26 serving as a node N3 or N4, which is connected to a wiring line M23 or M25 forming the VDD2 via a wiring line M133 or M134. Further, the connection of the gates (corresponding to the MG131 and MG132) of the transfer gates to the word line is excluded, although this connection is included in the typical SRAM cell.

In the structure described above, the wiring lines M111, M112, M121, M122, and M131 to M134 may be respectively formed of metal wiring lines. Accordingly, these metal wiring lines M111, M112, M121, M122, and M131 to M134 may be formed, together with other metal wiring lines for, e.g., the VDD2 and the GND2 (such as the wiring lines M11 to M16 and M21 to M26), by use of the same layer and the same step. Thus, the semiconductor memory 100 according to the embodiment 1 can be easily manufactured by utilizing the existing SRAM cell layout and manufacturing process. Consequently, the semiconductor memory 100 can be manufactured inexpensively without requiring a layout change and/or a process addition that entail a cost increase.

As described above, according to the embodiment 1, the bias circuit 100B is provided to flow the leakage currents (11) to (13) equal to the leakage currents (1) to (3) generated in the entire memory cell array 100A, and thereby the GND1 potential can be stabilized. Further, even if the leakage currents (1) to (3) change due to a PVT variation, the leakage currents (11) to (13) in the bias circuit 100B can also change in response to the PVT variation in the same way, and thereby the GND1 potential can be stabilized also with respect to PVT variations. Further, the semiconductor memory according to the embodiment 1 can be easily manufactured by utilizing the existing SRAM cell layout and manufacturing process, and so the semiconductor memory 100 can be manufactured inexpensively without requiring a layout change and/or a process addition that entail a cost increase.

Embodiment 2

Next, an explanation will be given of a semiconductor memory according to an embodiment 2 in detail with reference to the accompanying drawings. In the following description, the constituent elements and operations corresponding to those of the embodiment 1 are denoted by the same reference symbols, and their repetitive description will be suitably omitted.

Figure 7:
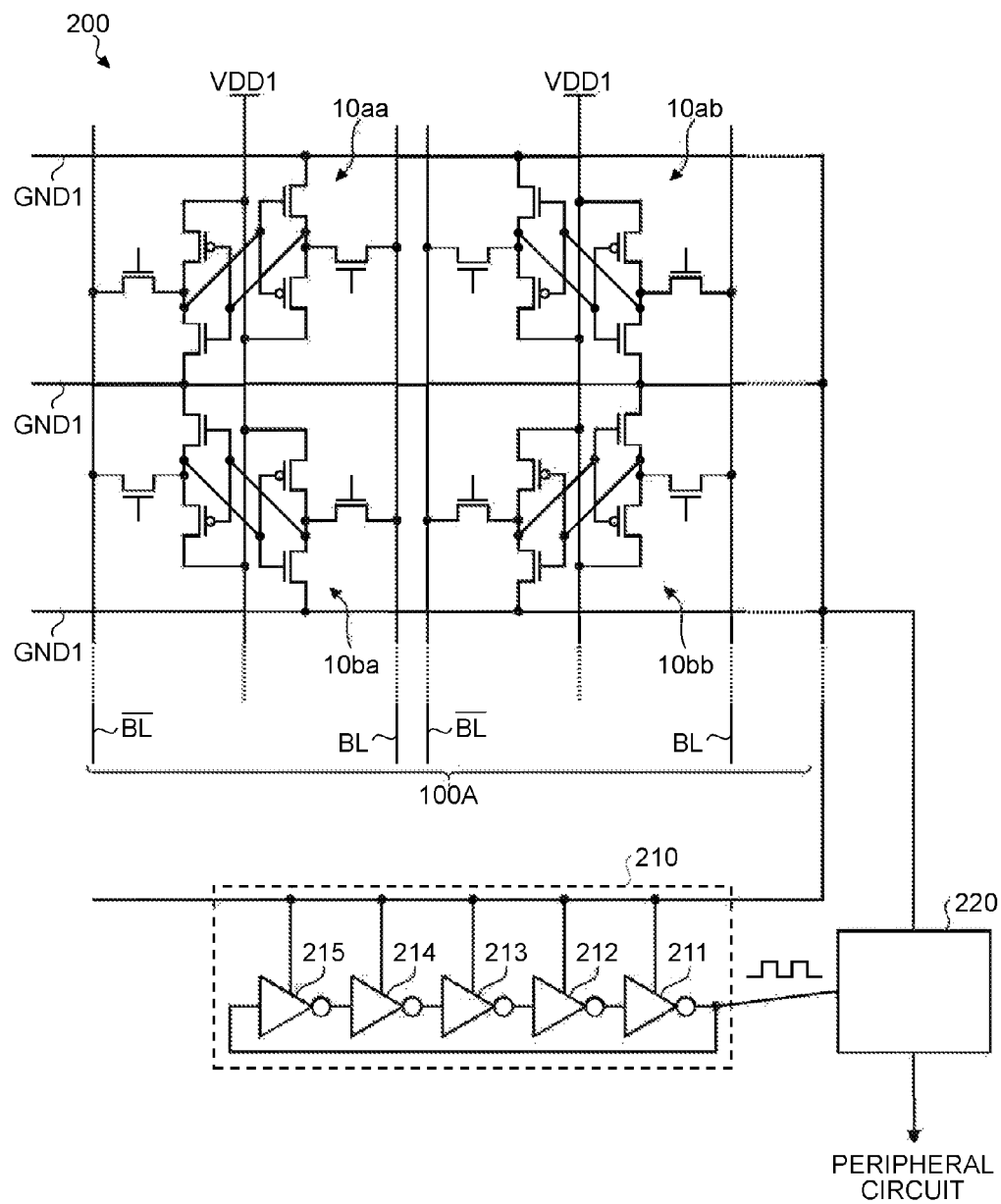
FIG. 7 is a schematic diagram showing a concrete configuration example of a semiconductor memory according to an embodiment 2.

FIG. 7 is a schematic diagram showing a concrete configuration example of a semiconductor memory according to the embodiment 2. As shown in FIG. 7, the semiconductor memory 200 according to the embodiment 2 includes a memory cell array 100A, a ring oscillator 210, and a charge pump circuit 220. The memory cell array 100A may be the same as the memory cell array 100A illustrated in the embodiment 1.

The ring oscillator 210 is composed of a plurality of inverters 211 to 215 connected in series, for example. This ring oscillator 210 can serve the same function as a switched capacitor connected to a GND1. Specifically, the ring oscillator 210 is configured to output a periodic voltage signal, when an electric potential generated in the GND1 exceeds a certain value. As a result, the electric charge accumulated in the GND1 is consumed, and thereby the GND1 potential is lowered. In this way, the ring oscillator 210 operates to reduce the GND1 potential when the potential exceeds a certain value, and so it can stabilize the GND1 potential. Here, FIG. 7 shows a case that the number of stages in the ring oscillator 210 is five, but this is not limiting. This number may be set appropriately in accordance with the scale of the leakage currents generated in the memory cell array 100A, for example.

The voltage signal generated by the ring oscillator 210 may be boosted by the charge pump circuit 220 connected to the output stage of the ring oscillator 210, and supplied to a peripheral circuit. In this case, the consumption of a power supply voltage VDD in the peripheral circuit can be reduced.

As described above, according to the embodiment 2, the ring oscillator 210 serving the same function as a switched capacitor is connected to the GND1, and thereby the GND1 potential can be stabilized, as in the embodiment 1. Further, a voltage signal generated by the ring oscillator 210 can be boosted by the charge pump circuit 220 connected to the output stage of the ring oscillator 210, and utilized as a power for a peripheral circuit, and thereby the consumption of a power supply voltage VDD in the peripheral circuit can be reduced. The other constituent elements, operations, and effects are the same as those of the embodiment 1, and so their detailed description is suitably omitted here. It should be noted that the ring oscillator 210 and/or the charge pump circuit 220 may be formed on a substrate the same as the semiconductor substrate on which the memory cell array 100A is formed, or may be formed on a substrate different from the semiconductor substrate on which the memory cell array 100A is formed.

Figure 8:
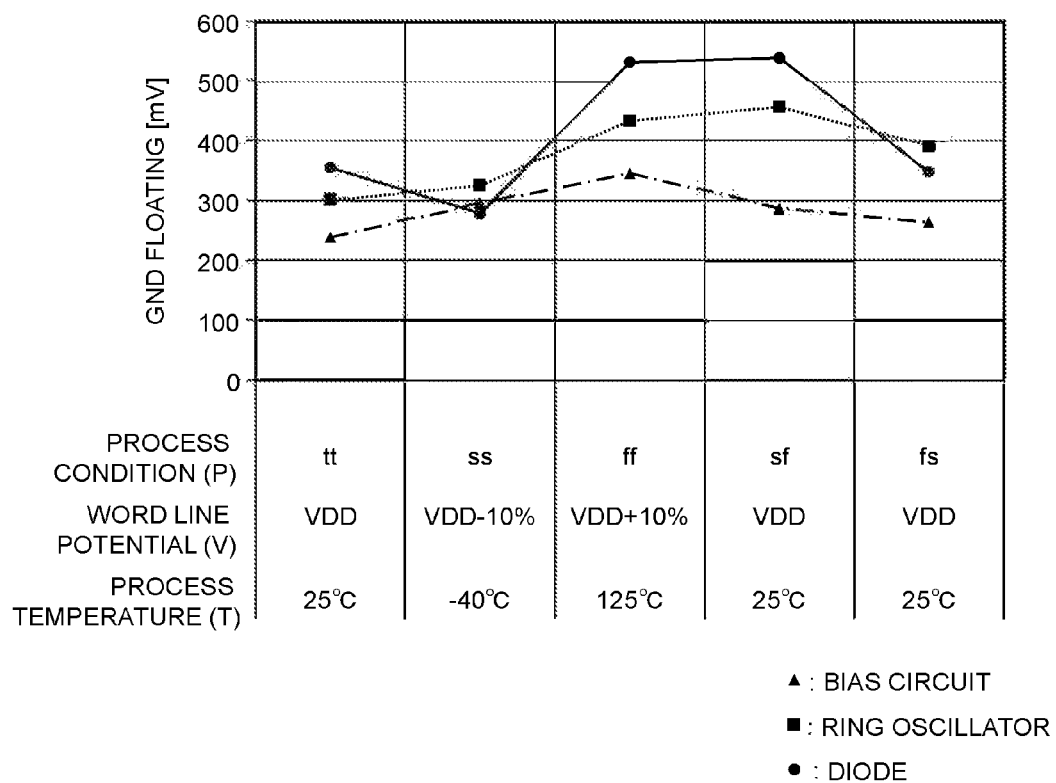
FIG. 8 is a view showing simulation results about the effect of suppressing electric potential fluctuations, according to the embodiments 1 and 2.

Next, an explanation will be given of the effect of suppressing electric potential fluctuations according to the embodiments 1 and 2, with reference to the simulation result shown in FIG. 8. In FIG. 8, the one-dot broken line denotes the electric potential floating of the GND1 in the case (case 1) that the bias circuit 100B according to the embodiment 1 is connected to the GND1, the broken line denotes the electric potential floating of the GND1 in the case (case 2) that the ring oscillator 210 according to the embodiment 2 is connected to the GND1, and the solid line denotes the electric potential floating of the GND1 in the case (case 3) that a diode simply formed of a transistor is connected to the GND1.

As shown in FIG. 8, in the case 3 that a diode simply formed of a transistor is connected to the GND1, the electric potential floating of the GND1 is relatively largely fluctuated depending on PVT variations. On the other hand, in the case 1 according to the embodiment 1, the fluctuations in the electric potential floating of the GND1 are reduced to about 1/2.5 of the case 3. Further, also in the case 2 according to the embodiment 2, the fluctuations in the electric potential floating of the GND1 are reduced to about 1/1.7 of the case 3.

As described above, in the semiconductor memories according to the embodiments 1 and 2, the GND1 potential fluctuations with respect to PVT variations can be suppressed. Consequently, the deterioration of the retention characteristic with respect to PVT variations can be reduced.

Embodiment 3

Next, an explanation will be given of a semiconductor memory according to an embodiment 3 in detail with reference to the accompanying drawings. In the following description, the constituent elements and operations corresponding to those of the embodiment 1 or 2 are denoted by the same reference symbols, and their repetitive description will be suitably omitted.

Figure 9:
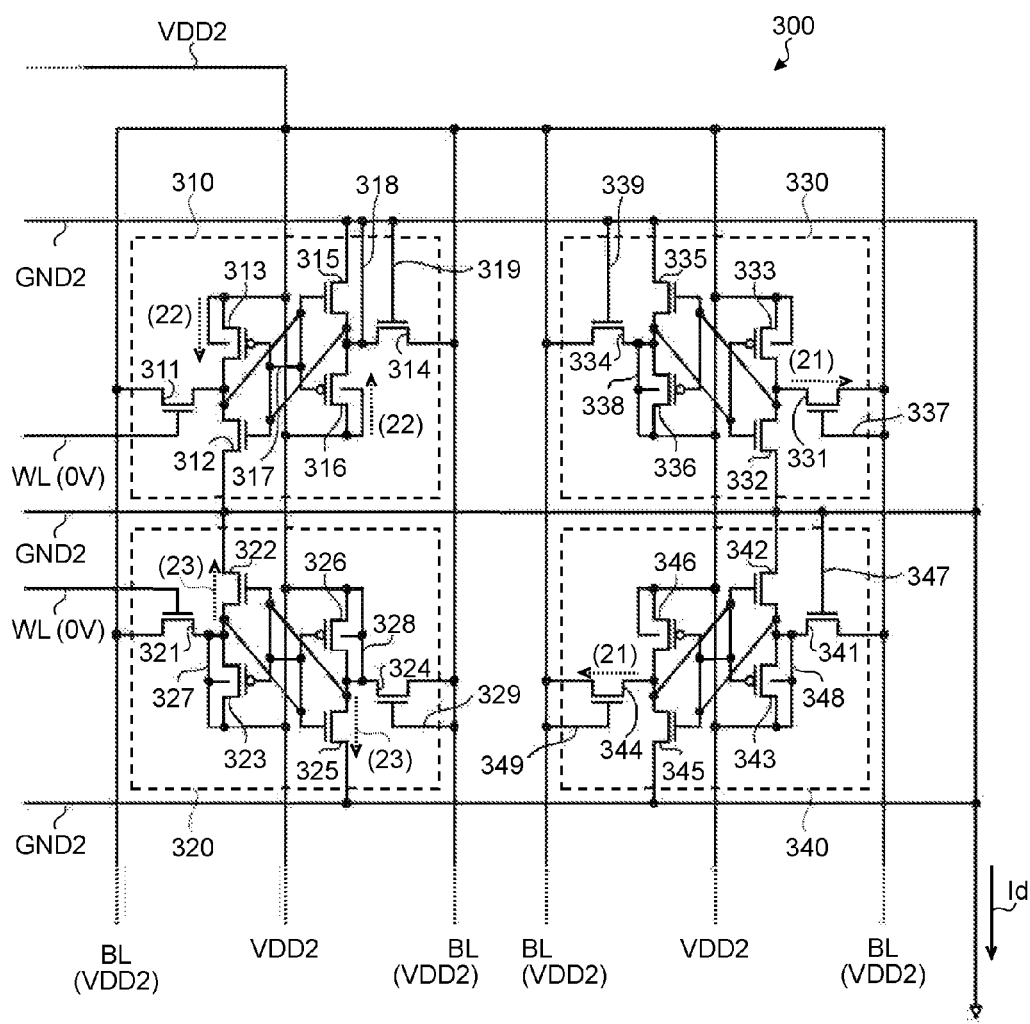
FIG. 9 is a circuit diagram showing a schematic configuration example of a bias circuit according to an embodiment 3.

In the embodiment 3, another configuration example of the bias circuit according to the embodiment 1 will be explained. FIG. 9 is a circuit diagram showing a schematic configuration example of a bias circuit according to the embodiment 3. Here, a schematic configuration of a semiconductor memory according to the embodiment 3 may be in a state where the semiconductor memory 100 illustrated in FIG. 3 includes the bias circuit 300 shown in FIG. 9 in place of the bias circuit 100B, for example.

As shown in FIG. 9, the bias circuit 300 includes cells 310 to 340 of four kinds each having almost the same structure as the SRAM cell 10. The number of cells of each kind of the cells 310 to 340 is not limited to one, but may be set appropriately in accordance with the scale of the leakage currents (1) to (3) generated in the memory cell array (for example, the memory cell array 10A shown in FIG. 2). Here, the scale of the leakage currents generated in the memory cell array is assumed to be a current amount given by the formula (1) described above.

Figure 10:
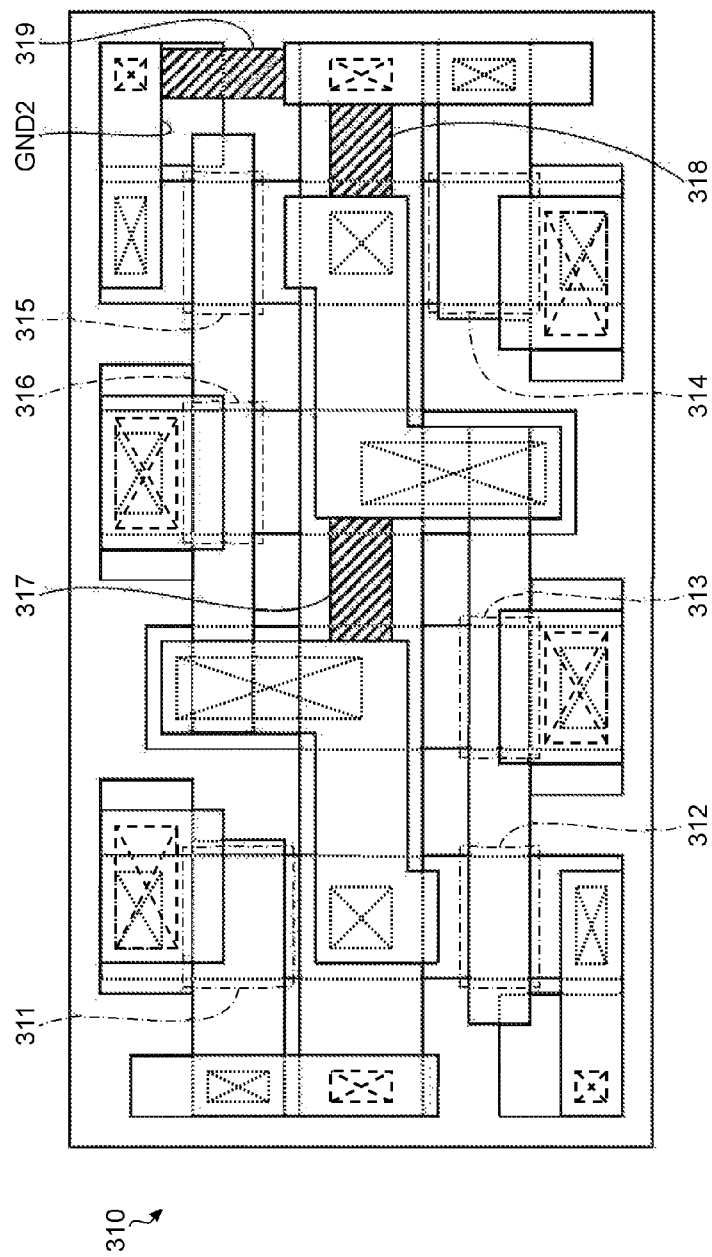
FIG. 10 is a schematic view showing a cell layout example according to the embodiment 3.

At first, a schematic configuration example of the cell 310 will be explained by use of the circuit diagram shown in FIG. 9 and the cell layout example shown in FIG. 10, As shown in FIGS. 9 and 10, the cell 310 includes two NMOS transistors 311 and 314 used for constituting transfer gates, and two NMOS transistors 312 and 315 and two PMOS transistors 313 and 316 used for constituting two inverters cross-connected to each other. The gates of the totally four transistors 312, 313, 315, and 316 constituting the two inverters are connected to each other via a metal wiring line 317, for example. Further, the sources of the transistors 315 and 316 constituting one of the inverters and a node connected to the source of the NMOS transistor 314 constituting one of the transfer gates are connected to a GND2 via a metal wiring line 318. Further, the gate of the NMOS transistor 314 is connected to the GND2 via a metal wiring line 319.

Figure 11:
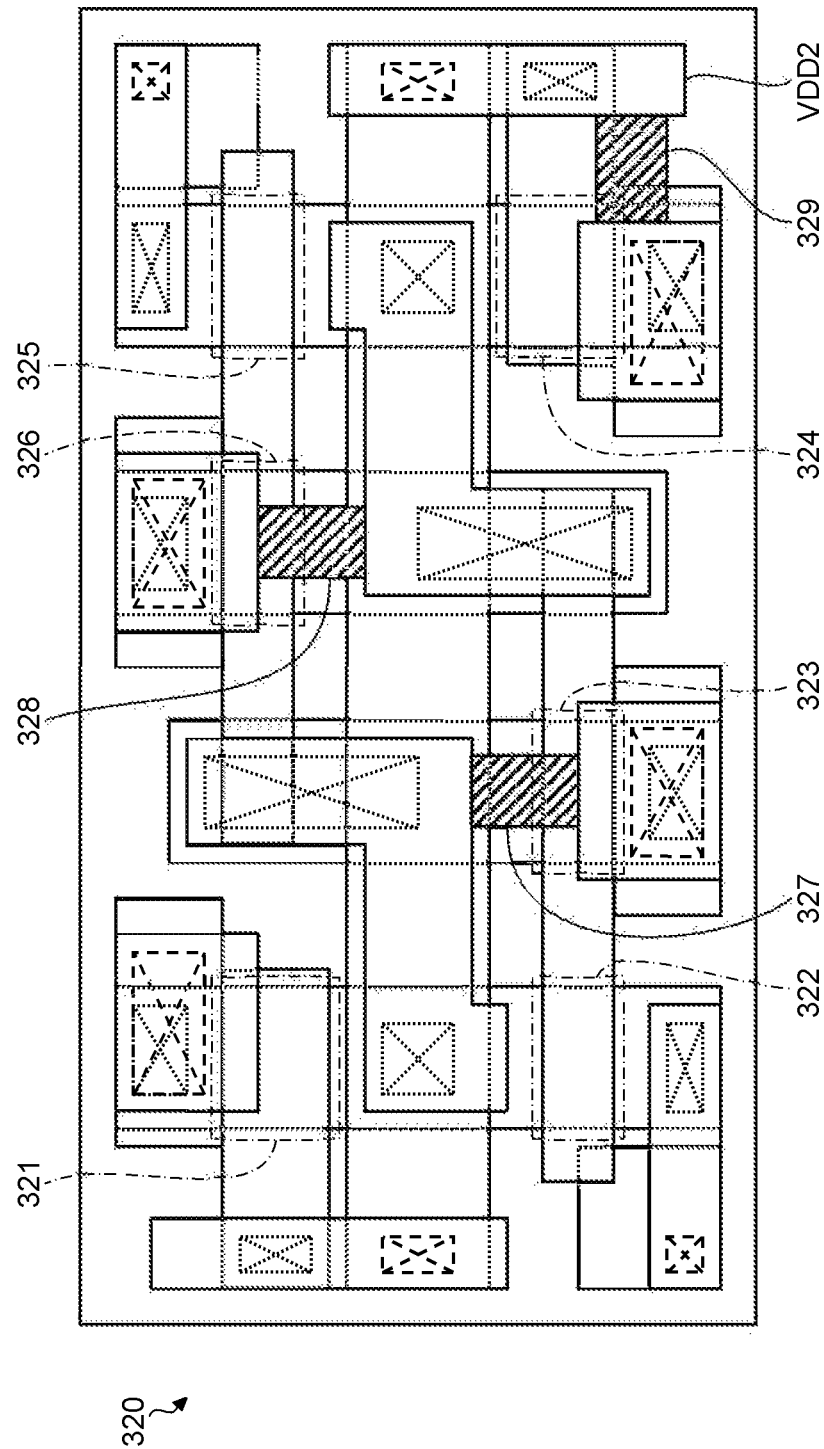
FIG. 11 is a schematic view showing another cell layout example according to the embodiment 3.

Next, a schematic configuration example of the cell 320 will be explained by use of the circuit diagram shown in FIG. 9 and the cell layout example shown in FIG. 11. As shown in FIGS. 9 and 11, the cell 320 includes two NMOS transistors 321 and 324 used for constituting transfer gates, and two NMOS transistors 322 and 325 and two PMOS transistors 323 and 326 used for constituting two inverters cross-connected to each other. The back gate of the PMOS transistor 323 is connected to a node via a metal wiring line 327, and this node is connected to the sources of the transistors 322 and 323 constituting one of the inverters and the source of the NMOS transistor 321 constituting one of the transfer gates. Similarly, the back gate of the PMOS transistor 326 is connected to a node via a metal wiring line 328, and this node is connected to the sources of the transistors 325 and 326 constituting the other of the inverters and the source of the NMOS transistor 324 constituting the other of the transfer gates. Further, the gate of the NMOS transistor 324 is connected to VDD2 via a metal wiring line 329.

Figure 12:
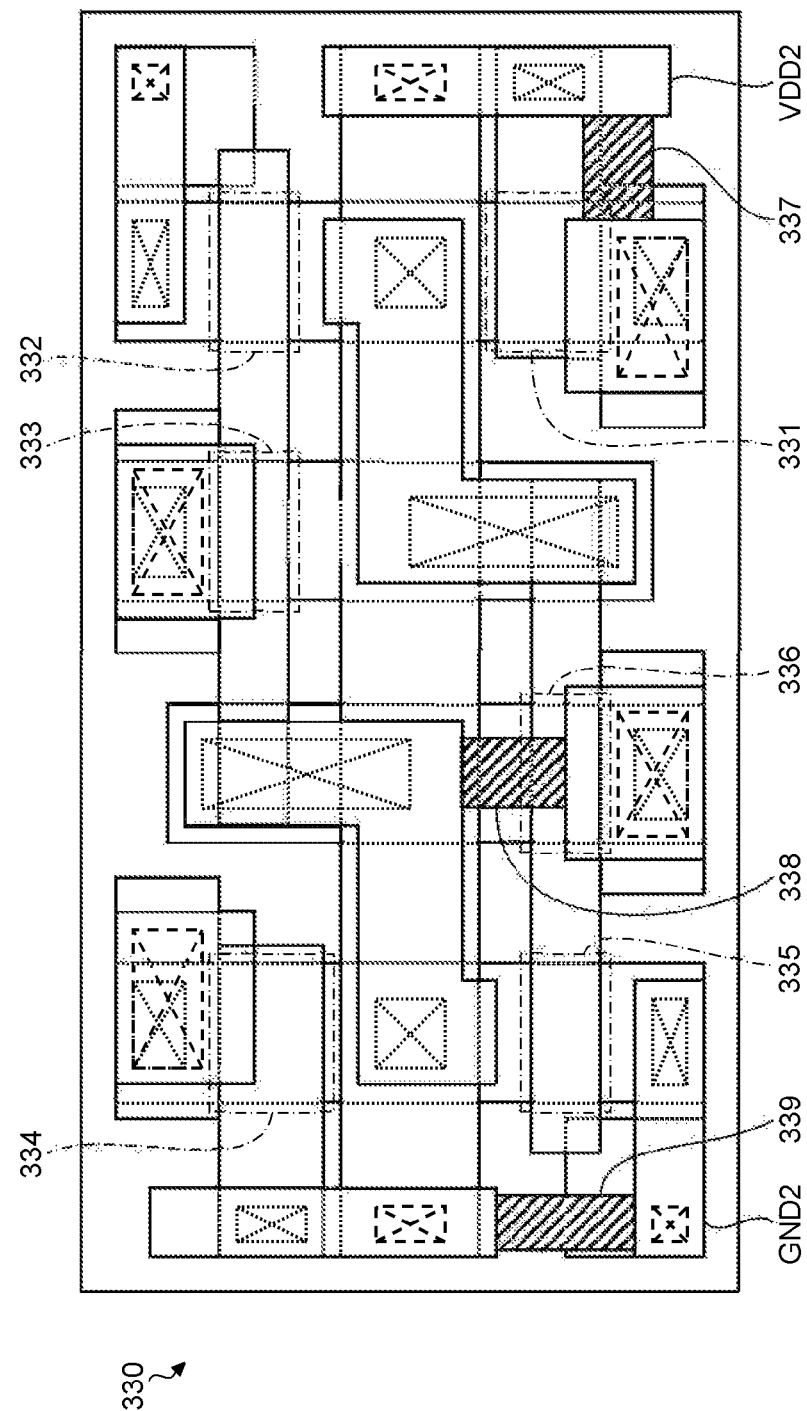
FIG. 12 is a schematic view showing still another cell layout example according to the embodiment 3.

Next, a schematic configuration example of the cell 330 will be explained by use of the circuit diagram shown in FIG. 9 and the cell layout example shown in FIG. 12. As shown in FIGS. 9 and 12, the cell 330 includes two NMOS transistors 331 and 334 used for constituting transfer gates, and two NMOS transistors 332 and 335 and two PMOS transistors 333 and 336 used for constituting two inverters cross-connected to each other. The gate of the NMOS transistor 331 constituting one of the transfer gates is connected to the VDD2 via a metal wiring line 337. The back gate of the PMOS transistor 336 is connected to a node via a metal wiring line 338, and this node is connected to the sources of the transistors 335 and 336 constituting one of the inverters and the source of the NMOS transistor 334 constituting one of the transfer gates. Further, the gate of the NMOS transistor 334 is connected to the GND2 via a metal wiring line 339.

Figure 13:
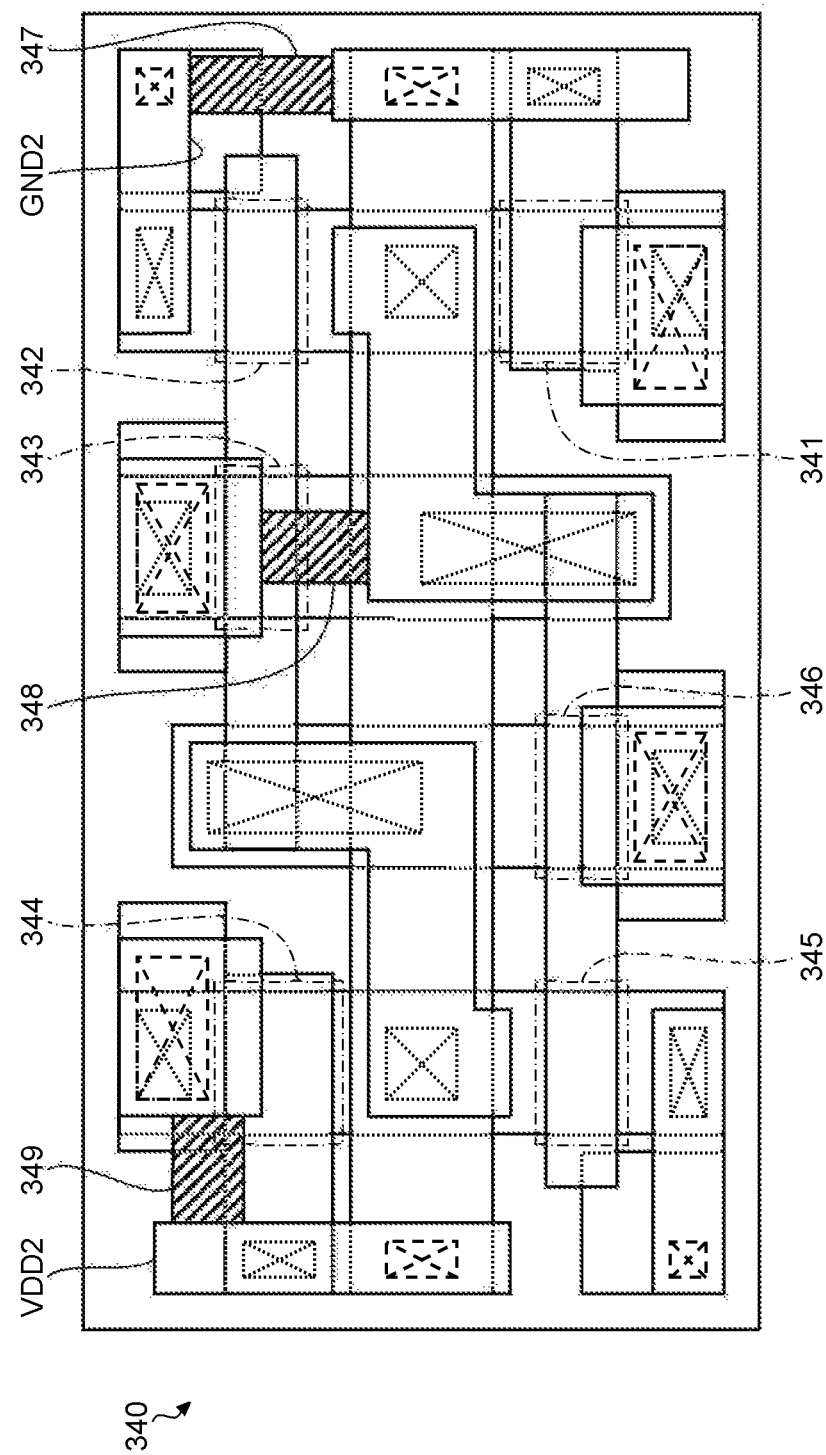
FIG. 13 is a schematic view showing still another cell layout example according to the embodiment 3.

Further, a schematic configuration example of the cell 340 will be explained by use of the circuit diagram shown in FIG. 9 and the cell layout example shown in FIG. 13. As shown in FIGS. 9 and 13, the cell 340 includes two NMOS transistors 341 and 344 used for constituting transfer gates, and two NMOS transistors 342 and 345 and two PMOS transistors 343 and 346 used for constituting two inverters cross-connected to each other. The gate of the NMOS transistor 341 constituting one of the transfer gates is connected to the GND2 via a metal wiring line 347. On the other hand, the gate of the NMOS transistor 344 constituting the other of the transfer gates is connected to the VDD2 via a metal wiring line 349. The back gate of the PMOS transistor 343 is connected to a node via a metal wiring line 348, and this node is connected to the sources of the transistors 342 and 343 constituting one of the inverters and the source of the NMOS transistor 341 constituting one of the transfer gates.

The bias circuit 300 having the configuration described above operates to flow a leakage current (21) equal to the leakage current (1) in the entire memory cell array 100A, through the cells 330 and 340. Further, it operates to flow a leakage current (22) equal to the leakage current (2) in the entire memory cell array 100A, through the cell 310. Further, it operates to flow a leakage current (23) equal to the leakage current (3) in the entire memory cell array 100A, through the cell 320. Accordingly, the bias circuit 300 having the configuration described above is connected to the GND1 of the memory cell array 100A, and thereby makes it possible to flow the leakage currents (21) to (23) equal to the leakage currents (1) to (3) in the entire memory cell array 100A. Consequently, the GND1 potential can be stabilized. The other constituent elements, operations, and effects are the same as those of the embodiments described above, and so their detailed description is suitably omitted here.

Embodiment 4

Next, an explanation will be given of a semiconductor memory according to an embodiment 4 in detail with reference to the accompanying drawings. In the embodiment 2 described above, its configuration is illustrated such that a voltage signal generated from an electric potential generated in the GND1 of the memory cell array 100A is supplied as a power for a peripheral circuit. On the other hand, in the embodiment 4, an explanation will be given of an example where a substrate bias voltage is generated from an electric potential generated in the GND1 of the memory cell array 100A. In the following description, the constituent elements and operations corresponding to those of the embodiment 1 to 3 are denoted by the same reference symbols, and their repetitive description will be suitably omitted.

Figure 14:
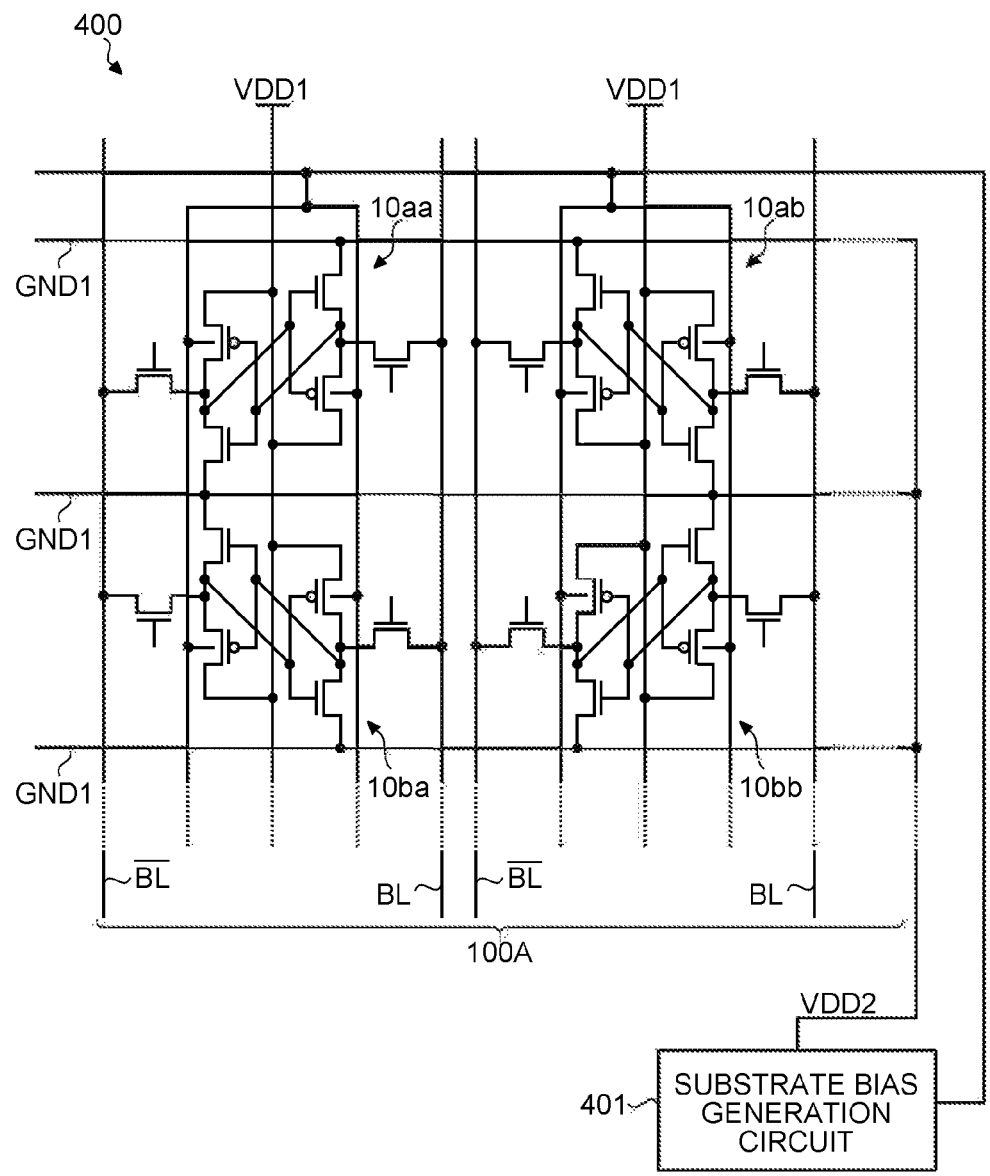
FIG. 14 is a schematic diagram showing a concrete configuration example of a semiconductor memory according to an embodiment 4.

FIG. 14 is a schematic diagram showing a concrete configuration example of a semiconductor memory according to the embodiment 4. As shown in FIG. 14, the semiconductor memory 400 according to the embodiment 4 includes a memory cell array 100A and a substrate bias generation circuit 401. The memory cell array 100A may be the same as the memory cell array 100A in the semiconductor memory 200 illustrated in FIG. 7, for example. Further, the substrate bias generation circuit 401 may be formed on a substrate the same as the semiconductor substrate on which the memory cell array 100A is formed, or may be formed on a substrate different from the semiconductor substrate on which the memory cell array 100A is formed.

Figure 15:
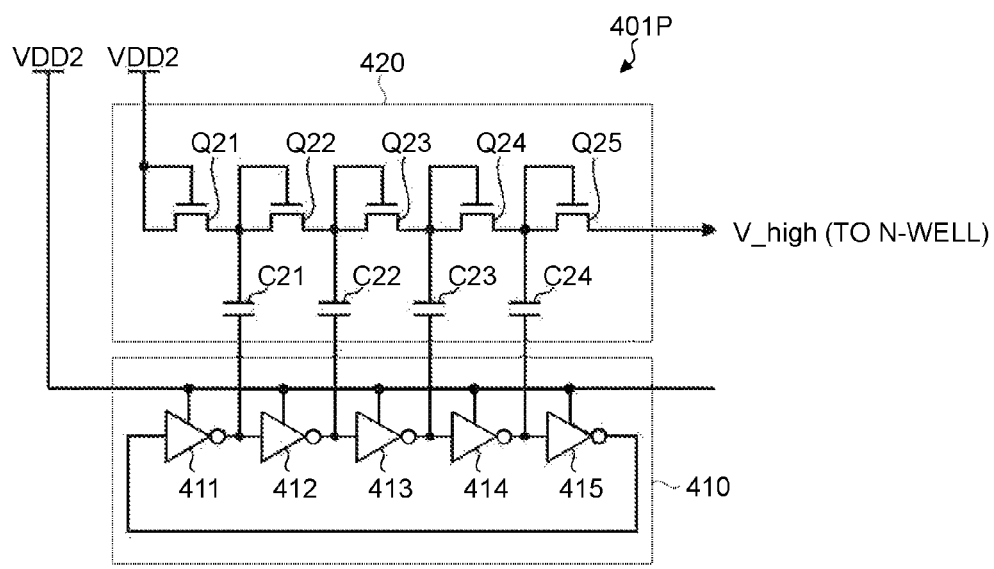
FIG. 15 is a circuit diagram showing a schematic configuration example of a substrate bias generation circuit directed to PMOS transistors according to the embodiment 4.

The substrate bias generation circuit 401 connected to the GND1 of the memory cell array 100A, and configured to generate a substrate bias voltage from the electric potential generated in this GND1. Here, the substrate bias generation circuit 401 illustrated in FIG. 14 is a substrate bias generation circuit directed to PMOS transistors. Accordingly, the output of the substrate bias generation circuit 401 is connected to the N-well (N-WELL) of each PMOS transistor in the memory cell array 100A. FIG. 15 shows a schematic configuration example of the substrate bias generation circuit directed to PMOS transistors.

As shown in FIG. 15, the substrate bias generation circuit 401P directed to PMOS transistors includes a ring oscillator 410 and a charge pump circuit 420.

As in the ring oscillator 210 according to the embodiment 2 described above, for example, the ring oscillator 410 is composed of a plurality of inverters 411 to 415 connected in series, and can serve the same function as a switched capacitor connected to the GND1. Accordingly, when an electric potential generated in the GND1 exceeds a certain value, the ring oscillator 410 oscillates and consumes the electric charge accumulated in the GND1. As a result, the GND1 potential is lowered, and thereby the GND1 potential is stabilized. Here, the number of stages in the ring oscillator 410 may be set appropriately in accordance with the scale of the leakage currents generated in the memory cell array 100A, for example.

The charge pump circuit 420 has a configuration in which a plurality of (e.g., five in FIG. 15) NMOS transistors Q21 to Q25 are connected in series and each of these transistors has its gate and drain connected to each other. The NMOS transistors Q21 to Q25 respectively constitute amplification stages. The wiring lines connecting the amplification stages in series have branches that are respectively connected, through capacitors C21 to C24, to wiring lines connecting the inverters 411 to 415 in series. Here, the number of stages in the charge pump circuit 420 may be set appropriately in accordance with the necessary amplification factor and/or the scale of the leakage currents generated in the memory cell array 100A, for example.

The GND1 connected to the memory cell array 100A, i.e., the virtual power supply voltage VDD2, is connected to the inverters 411 to 415 of the ring oscillator 410, and is also connected to the gate and drain of the first stage NMOS transistor Q21 of the charge pump circuit 420. Here, when the electric potential generated in the GND1 exceeds a certain value and causes the ring oscillator 410 to oscillate, the respective stage capacitors C21 to C24 are charged, and thereby the electric potentials of the wiring lines connecting the NMOS transistors Q21 to Q25 are raised.

On the other hand, each of the NMOS transistors Q21 to Q24 at respective amplification stages in the charge pump circuit 420 amplifies the VDD2 or the electric potential of the wiring line connecting with the precedent amplification stage, and outputs it to the wiring line connecting with the subsequent amplification stage. As a result, the NMOS transistor Q25 at the last amplification stage outputs a substrate bias voltage V_high that has been boosted to a higher voltage value than the power supply voltage VDD1. This substrate bias voltage V_high is applied to the N-well (N-WELL) of each PMOS transistor in the memory cell array 100A.

In this way, the substrate bias voltage V_high generated by the charge pump circuit 420 is applied to the N-well of each PMOS transistor in the memory cell array 100A, and thereby the electric potential of the N-well of each PMOS transistor can be raised. Consequently, the leakage currents during the retention can be further reduced.

Here, in the case that the MOS transistors of the memory cell array 100A are formed by use of a triple well structure, the substrate bias voltage V_high generated by the substrate bias generation circuit 401P may be applied to the N-well of each NMOS transistor in the memory cell array 100A. In this case, the leakage currents during the retention can be further reduced.

Figure 16:
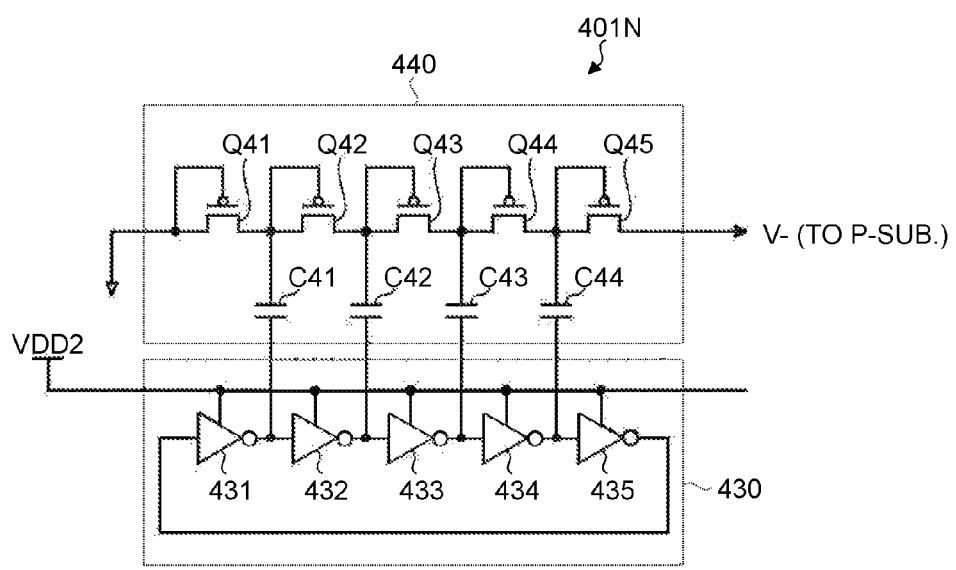
FIG. 16 is a circuit diagram showing a schematic configuration example of a substrate bias generation circuit directed to NMOS transistors according to the embodiment 4.

Further, in place of the substrate bias generation circuit 401P shown in FIG. 15, or together with the substrate bias generation circuit 401P, a substrate bias generation circuit directed to NMOS transistors may be provided as a substrate bias generation circuit 401N on the semiconductor memory 400. FIG. 16 shows a schematic configuration example of the substrate bias generation circuit directed to NMOS transistors.

As shown in FIG. 16, the substrate bias generation circuit 401N directed to NMOS transistors includes a ring oscillator 430 and a charge pump circuit 440.

As in the ring oscillator 410 of the substrate bias generation circuit 401P directed to PMOS transistors, for example, the ring oscillator 430 is composed of a plurality of inverters 431 to 435 connected in series, and can serve the same function as a switched capacitor connected to the GND1.

Accordingly, when an electric potential generated in the GND1 exceeds a certain value, the ring oscillator 430 oscillates and consumes the electric charge accumulated in the GND1. As a result, the GND1 potential is lowered, and thereby the GND1 potential is stabilized. Here, the number of stages in the ring oscillator 430 may be set appropriately in accordance with the scale of the leakage currents generated in the memory cell array 100A, for example.

The charge pump circuit 440 has a configuration in which a plurality of (e.g., five in FIG. 16) PMOS transistors Q41 to Q45 are connected in series and each of these transistors has its gate and drain connected to each other. However, the gate inputs of the respective PMOS transistors Q41 to Q45 are reversed. The PMOS transistors Q41 to Q45 respectively constitute amplification stages. The wiring lines connecting the amplification stages in series have branches that are respectively connected, through capacitors C41 to C44, to wiring lines connecting the inverters 431 to 435 in series. Here, the number of stages in the charge pump circuit 440 may be set appropriately in accordance with the necessary amplification factor and/or the scale of the leakage currents generated in the memory cell array 100A, for example, as in the ring oscillator 430.

The GND1 connected to the memory cell array 100A, i.e., the virtual power supply voltage VDD2, is connected to the inverters 431 to 435 of the ring oscillator 430. Here, when the electric potential generated in the GND1 exceeds a certain value and causes the ring oscillator 430 to oscillate, the respective stage capacitors C41 to C44 are charged, and thereby the electric potentials of the wiring lines connecting the PMOS transistors Q41 to Q45 are raised.

On the other hand, each of the PMOS transistors Q41 to Q44 at respective amplification stages in the charge pump circuit 440 amplifies the ground potential or the electric potential of the wiring line connecting with the precedent amplification stage, and outputs it to the wiring line connecting with the subsequent amplification stage. As a result, the PMOS transistor Q45 at the last amplification stage outputs a substrate bias voltage V− having a negative electric potential. This substrate bias voltage V− is applied to the semiconductor substrate on which the memory cell array 100A is formed.

In this way, the substrate bias voltage V− generated by the charge pump circuit 440 is applied to the semiconductor substrate on which the memory cell array 100A is formed, and thereby the substantial threshold voltage of each NMOS transistor becomes larger, and so the leakage currents during the retention can be further reduced.

As described above, the configuration composed of the ring oscillator 410/430 and the charge pump circuit 420/440 can also be used as the substrate bias generation circuit 401 for generating a substrate bias voltage or voltages V_high and/or V− to further reduce the leakage currents during the retention. The substrate bias generation circuit 401 thus configured can automatically operate when a leakage current exceeds a certain value, and so it can provide an effect capable of reducing the leakage current at an effective timing, in addition to the effect capable of stabilizing the GND1 potential by use of oscillation of the ring oscillator 410/430.

The other constituent elements, operations, and effects are the same as those of the embodiments described above, and so their repetitive description is suitably omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
    a memory cell array composed of a plurality of SRAM cells, one of which includes a first NMOS transistor and a first PMOS transistor; and
    a bias circuit connected to a first ground line or a power supply voltage line of the memory cell array, wherein
    the bias circuit includes a second NMOS transistor that is same as the first NMOS transistor in terms of channel length and channel width and in terms of dopant and dose amount at a channel portion, and a second PMOS transistor that is same as the first PMOS transistor in terms of channel length and channel width and in terms of dopant and dose amount at a channel portion,
    diffusion regions of the first and second NMOS transistors and diffusion regions of the first and second PMOS transistors are formed in a same semiconductor layer,
    the bias circuit includes one or more bias cells,
    one of the one or more bias cells includes four transistors that constitute two inverters cross-connected to each other, and two transistors that constitute transfer gates for performing readout and write, and
    the NMOS transistor and the PMOS transistor correspond to one or more of the four transistors that constitute the two inverters and the two transistors that constitute the transfer gates.

2. The semiconductor memory according to claim 1, wherein the bias circuit is arranged in a column direction relative to the memory cell array.

3. The semiconductor memory according to claim 1, wherein the one of the one or more bias cells has a layout structure common to the SRAM cells.

4. The semiconductor memory according to claim 1, wherein
    the one or more bias cells of the bias circuit includes a first bias cell and a second bias cell,
    the four transistors in the first bias cell are two first NMOS transistors and two first PMOS transistors that constitute the two inverters,
    the transfer gates in the first bias cell include two second NMOS transistors, and
    the one or more transistors of the second bias cell are two third NMOS transistors and two second PMOS transistors that constitute the two inverters,
    the transfer gates of the second bias cell include two fourth NMOS transistors,
    gates of the second NMOS transistors and gates of the fourth NMOS transistors are connected to the first ground line,
    sources of the first NMOS transistors, sources of the first PMOS transistors, and sources of the second NMOS transistors are connected to a second ground line different from the first ground line,
    sources of the third NMOS transistors, sources of the second PMOS transistors, sources of the fourth NMOS transistors are connected to the second ground line, and
    the NMOS transistor and the PMOS transistor correspond to one or more of the first to fourth NMOS transistors and the first and second PMOS transistors.

5. The semiconductor memory according to claim 1, wherein
the one or more bias cells of the bias circuit includes first to fourth bias cells,
the four transistors in the first bias cell are two first NMOS transistors and two first PMOS transistors that constitute the two inverters,
the transfer gates in the first bias cell include two second NMOS transistors,
the four transistors in the second bias cell are two third NMOS transistors and two second PMOS transistors that constitute the two inverters,
the transfer gates in the second bias cell include two fourth NMOS transistors,
the four transistors in the third bias cell are two fifth NMOS transistors and two third PMOS transistors that constitute the two inverters,
the transfer gates in the third bias cell include two sixth NMOS transistors, and
the four transistors in the fourth bias cell are two seventh NMOS transistors and two fourth PMOS transistors that constitute the two inverters,
the transfer gates in the fourth bias cell include two eighth NMOS transistors,
in the first bias cell,
gates of the first NMOS transistors and gates of the first PMOS transistors are connected to each other,
sources of one of the first NMOS transistors and one of the first PMOS transistors that constitute one of the two inverters and a source of one of the two second NMOS transistors are connected to a second ground line different from the first ground line, and
a gate of this one of the two second NMOS transistors is connected to the second ground line, and
in the second bias cell,
back gates of the two second PMOS transistors are respectively connected to sources of these second PMOS transistor, and
a gate of one of the two fourth NMOS transistors is connected to the first ground line,
in the third bias cell,
a back gate of one of the two third PMOS transistors is connected to a source of this one of the third PMOS transistors, and
a gate of one of the two sixth NMOS transistors is connected to the first ground line, a gate of the other of the two sixth NMOS transistors is connected to the second ground line, and
in the fourth bias cell,
a back gate of one of the two fourth PMOS transistors is connected to a source of this one of the fourth PMOS transistors,
a gate of one of the two eighth NMOS transistors is connected to the first ground line, and a gate of the other of the two eighth NMOS transistors is connected to the second ground line, and
the NMOS transistor and the PMOS transistor correspond to one or more of the first to eighth NMOS transistors and the first to fourth PMOS transistors.

6. The semiconductor memory according to claim 1, wherein leakage currents in the bias circuit are expressed by a following formula (1):

$$Id = \beta \exp\left(\frac{V_{GS} - V_{TH} - \gamma V_{SB} + \eta V_{DS}}{NV_T}\right). \tag{1}$$

7. A semiconductor memory comprising:
a memory cell array including a plurality of SRAM cells; and
a ring oscillator connected to a ground line of the memory cell array.

8. The semiconductor memory according to claim 7, further comprising a charge pump circuit connected to an output stage of the ring oscillator.

9. The semiconductor memory according to claim 7, further comprising a charge pump circuit configured to amplify a voltage of the ground line, based on output voltages of a plurality of inverters that constitute the ring oscillator, wherein
a power supply voltage line of the ring oscillator is connected to the ground line of the memory cell array, and
an output of the charge pump circuit is connected to a semiconductor substrate on which the memory cell array is formed.

10. The semiconductor memory according to claim 9, wherein the memory cell array includes one or more PMOS transistors, and
the output of the charge pump circuit is connected to a well of the one or more PMOS transistors in the semiconductor substrate.

* * * * *